(12) United States Patent
Jin et al.

(10) Patent No.: US 6,461,904 B1
(45) Date of Patent: Oct. 8, 2002

(54) STRUCTURE AND METHOD FOR MAKING A NOTCHED TRANSISTOR WITH SPACERS

(75) Inventors: Bo Jin, Campbell; Chan-Lon Yang, Los Gatos, both of CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/757,451

(22) Filed: Jan. 9, 2001

(51) Int. Cl.[7] ............................................. H01L 21/338

(52) U.S. Cl. .......................................................... 438/182

(58) Field of Search ................................. 438/182, 184

(56) References Cited

U.S. PATENT DOCUMENTS

| | | | | |
|---|---|---|---|---|
| 4,892,835 A | * | 1/1990 | Rabinzohn et al. | 438/184 |
| 5,231,038 A | * | 7/1993 | Yamaguchi et al. | 438/30 |
| 6,204,133 B1 | * | 3/2001 | Yu et al. | 438/299 |

OTHER PUBLICATIONS

Wolf; Silicon Processing for the VLSI Era vol. 2: Process Integration, Sunset Beach, CA, 1990, pp. 370–373.*
*Encyclopedia of Chemical Technology*, 14, 677–709 (1995).
Krusin–Elbaum, L. et al., "Electrical Characterization of ZrN", *Mat. Res. Soc. Symp. Proc.*, 71, 351–356 (1986).
Long, W. et al., "Dual Material Gate Field Effect Transistor (DMGFET)", *IEDM*, 549–552 (1997).
Maiti, B. et al., "Metal Gates for Advanced CMOS Technology", *SPIE*, 3881, 46–57 (199).
Van Zant, Peter, *Microchip Fabrication*, McGraw Hill, 3rd edition, 491–529 (1997).

* cited by examiner

Primary Examiner—John F. Niebling
Assistant Examiner—Christopher Lattin
(74) Attorney, Agent, or Firm—Sonnenschein Nath & Rosenthal

(57) ABSTRACT

A method of forming a semiconductor structure includes filling a trench in a first dielectric layer with a gate material. The first dielectric layer is on a semiconductor substrate, and spacers are in the trench. A semiconductor device formed from this structure includes notched gates.

18 Claims, 4 Drawing Sheets

BACKGROUND STRUCTURE

BACKGROUND STRUCTURE

BACKGROUND STRUCTURE

STRUCTURE AND METHOD FOR MAKING A NOTCHED TRANSISTOR WITH SPACERS

BACKGROUND

The present invention relates to transistor structures.

A notched gate transistor provides a number of advantages in a semiconductor device. Since the gate length is smaller at the interface of the gate with the gate oxide, the total capacitance of the gate is reduced. Furthermore, by offsetting the interface of the gate with the gate oxide, from the source/drain extension implant regions (SDZ), a greater SDZ implant dose may be incorporated into the SDZ.

Notched gates for a notched gate transistor are illustrated in FIG. 3. The gates 8 are on a gate oxide layer 10, which is itself on a silicon substrate 2. The lower portions of the gates include notches, causing those parts of the gates that come into contact with the gate oxide smaller than the top of the gates. This structure may be formed by the method shown in FIGS. 1 and 2.

FIG. 1 illustrates a substrate 2, with a gate oxide layer 10 on the substrate, and a polycrystalline silicon (poly) layer 6 on the gate oxide layer. A photoresist layer 4 is applied on the poly layer 6, and patterned, to form the structure shown in FIG. 2. The poly layer is then etched, using the photoresist layer as a mask, to form the gates, and switched to an isotropic overetch, just prior to completion, to form the notches in the gates.

The above method of forming a notched gate transistor has disadvantages: it is difficult to consistently control the formation of the notch in the gate; and it is difficult to form spacers in the notch area. It would be desirable to have a method of forming a notched gate transistor without these disadvantages.

BRIEF SUMMARY

In a first aspect, the present invention is a method of forming a semiconductor structure, including filling a trench in a first dielectric layer with a gate material. The first dielectric layer is on a semiconductor substrate, and spacers are in the trench.

In a second aspect, the present invention is a method of making a semiconductor structure, including patterning a first dielectric layer, on a semiconductor substrate, to form a trench in the dielectric layer; forming spacers in the trench; and filling the trench with a gate material.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein.

DETAILED DESCRIPTION

The present invention includes a method, where a trench is filled to form a gate, rather than forming the gate by direct patterning. This allows for the notches of the gate to be defined by spacers in the trench. Since spacers are used to define the notches, consistent control of the formation of the spacers allows for consistent control of the formation of the notches. Furthermore, spacers will be present in the notch areas at the time the gate is formed, and therefore there is no need to form them after formation of the gates. An embodiment of the method of the present invention is illustrated in FIGS. 4–11.

Figure 1:
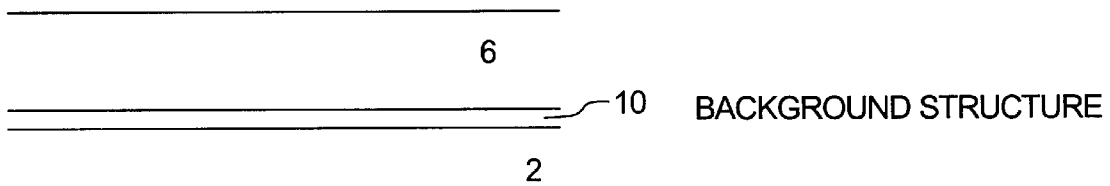
FIGS. 1 and 2 illustrate a method of forming notched gates.
Figure 2:
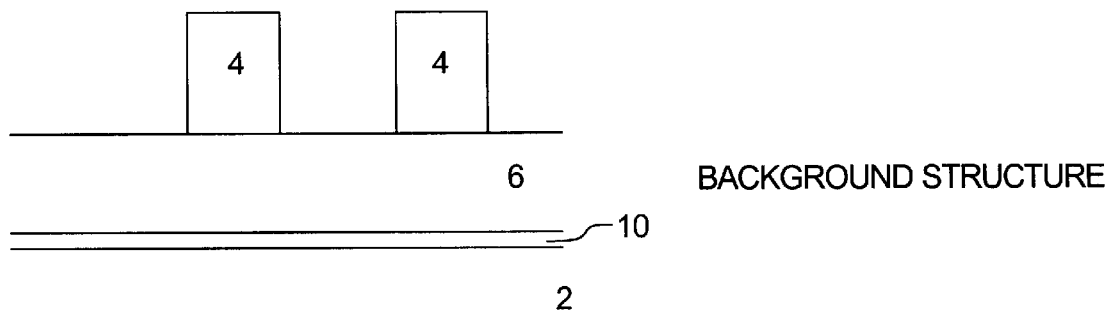
Figure 3:
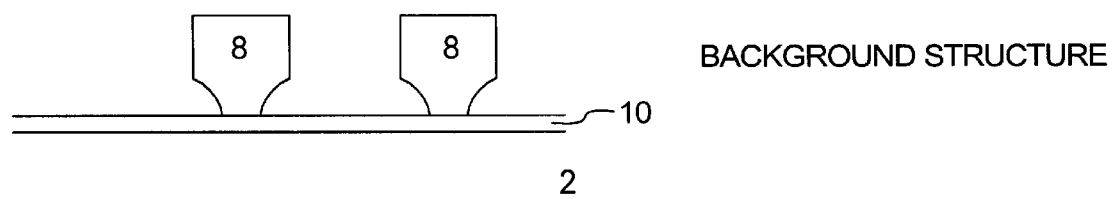
FIG. 3 shows notched gates for a notched gate transistor.
Figure 4:
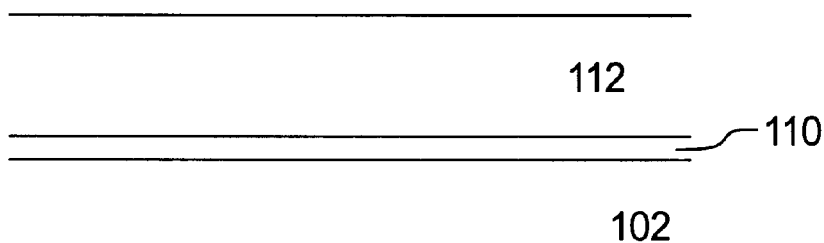
FIGS. 4–10 illustrate a method of forming the structure shown in FIG. 11.
Figure 5:
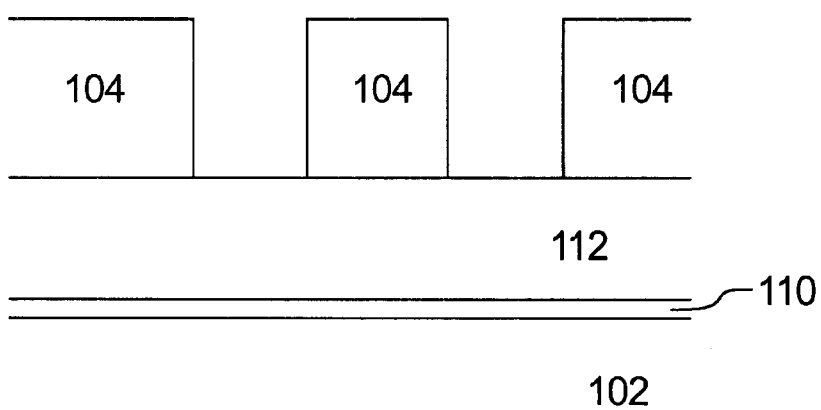

FIG. 4 illustrates a substrate 102, with a surface dielectric layer 110 on the substrate, and a first dielectric layer 112 on the surface dielectric layer. The surface dielectric layer is optional, and may be formed of the same, or a different, material as the first dielectric layer. A photoresist layer 104 is applied on the first dielectric layer 112, and patterned, to form the structure shown in FIG. 5. In this figure, the trenches defined by the photoresist layer correspond with trenches that will be formed in the first dielectric layer, which in turn will define where the gates of the transistor will be formed.

Figure 6:
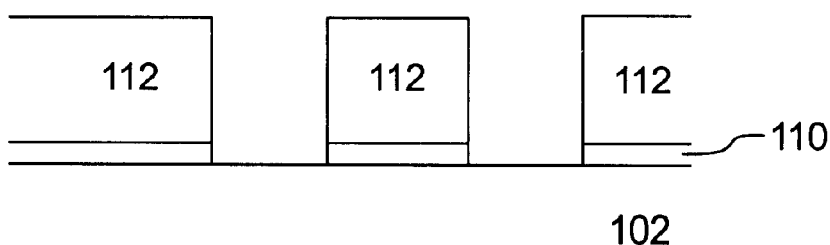
Figure 7:
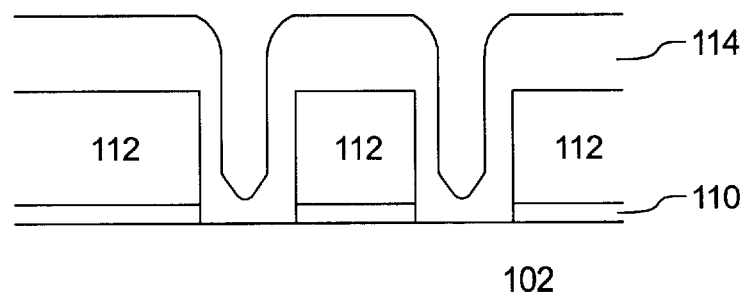
Figure 8:
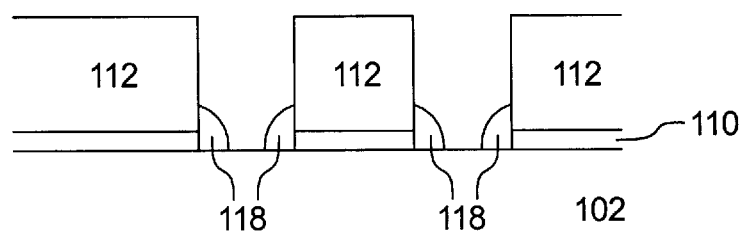

Next, the first dielectric layer 112 is etched, and the photoresist layer 104 is stripped, to give the structure illustrated in FIG. 6; if the surface dielectric layer 110 is present, optionally it may also be etched, as illustrated. A third dielectric layer 114 is then formed on the structure, as illustrated in FIG. 7. The third dielectric layer is formed of a different material from the first dielectric layer 112 which may be selectively etched over the first dielectric layer. The third dielectric layer is then etched to form notch spacers 118, which will define the notches in the gates, as shown in FIG. 8. If the surface dielectric layer 110 is present and was not previously etch, it may optionally be etched with the third dielectric layer.

Next, a gate dielectric 122 is formed between the notch spacers 118. The gate dielectric may be formed by oxidizing the exposed surface of the substrate 102, between the notch spacers 118. Alternatively, a dielectric layer may be applied over the structure to form the gate dielectric; in this case the layer will also be formed on top of the notch spacers 118, and along the inner surface of the trenches and on the top of the first dielectric layer 112. If the surface dielectric layer 110 is present, and was not previously etched, it will serve as the gate dielectric.

Figure 9:
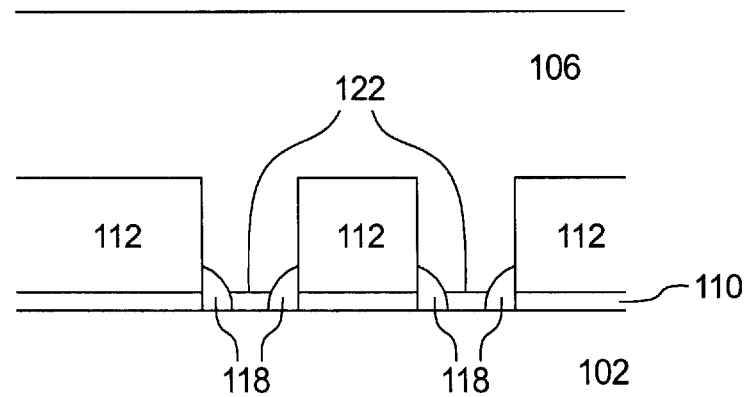
Figure 10:
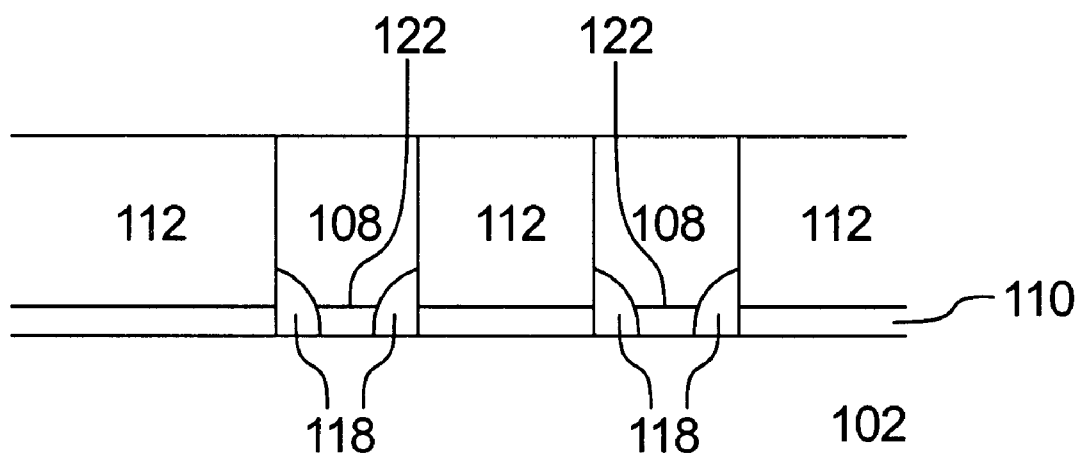
Figure 11:
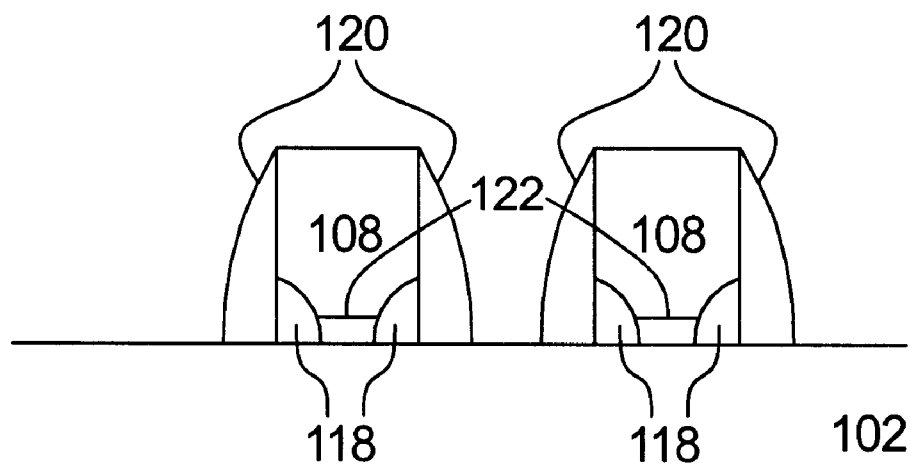
FIG. 11 shows a notched gate transistor.

Next, a gate material layer 106 is applied across the structure, forming the structure shown in FIG. 9. Preferably, the gate material layer comprises poly, but other conductive materials are also possible. Chemical mechanical polishing (CMP) may then be used to bring the surface of the gate material layer 106 to the top of the first dielectric layer 112, forming notched gates 108, as illustrated in FIG. 10. Next, the first dielectric layer 112 may be etched (as well as the surface dielectric layer 110, if present) to form outer spacers 120, as illustrated in FIG. 11. Alternatively, the first dielectric layer may be removed entirely, and a fourth dielectric layer applied that is then etched to form the outer spacers 120.

The cross-sectional width (i.e. horizontal length as illustrated in the figures) of the gate at the interface of the gate with the gate dielectric layer, is preferably at most 90 nm, more preferably at most 80 nm, and even more preferably at most 70 nm, for example 60 nm and 50 nm. Typically, the cross-sectional width of the gate at the opposite end is 120 nm. Preferably, the ratio of the cross-sectional width of the gate at the interface of the gate with the gate dielectric layer, to the cross-sectional width of the gate at the opposite end, is 1 to 1.1–2.4, more preferably 1 to 1.3–2, most preferably 1 to 1.45–1.75.

The source/drain regions, optionally SDZ, and other remaining parts of the transistor or semiconductor device may then be formed. Finally, the semiconductor device may be incorporated into an electronic device. In all embodiments, parts of the semiconductor device, such as source/drain regions, may be formed before, after, or during, the formation of the gates. Furthermore, as illustrated in the figures, two gates may be formed simultaneously; however, a single gate may be formed, or three or more gates may be formed simultaneously. In a CMOS device, the transistors are formed as complementary pairs, and optionally, each transistor of the pair may be part of a plurality of transistors, sharing common source/drain regions and including a plurality of gates.

The individual processing steps, including etching and deposition steps, for use in the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley, 1996; Wolf, Silicon Processing for the VLSI Era, Lattice Press, 1986, 1990, 1995 (vols 1–3, respectively), and Microchip Fabrication 3rd. edition, Peter Van Zant, McGraw-Hill, 1997.

The substrate may typically be a semiconductor material conventionally known by those of ordinary skill in the art. Examples include silicon, gallium arsenide, germanium, gallium nitride, aluminum phosphide, and alloys such as $Si_{1-x}Ge_x$ and $Al_xGa_{1-x}As$, where $0 \leq x \leq 1$. Many others are known, such as those listed in Semiconductor Device Fundamentals, on page 4, Table 1.1 (Robert F. Pierret, Addison-Wesley, 1996). Preferably, the semiconductor substrate is silicon, which may be doped or undoped.

The gate material layer may be any metallic or conductive material, such as metals and alloys, doped semiconductors, and metallic compounds. Examples of metals and alloys include Al, Cu, Au, Ag, W, Ti, Zr, Mo, Pt, Ir, Pd, Mg, Ta, Nb, Cr, Ni, and alloys thereof. Doped semiconductors include Si, Ge, SiGe, and mixture and alloys thereof; III-V semiconductors such as GaAs and InP, and mixtures and alloys thereof; and II-VI semiconductors such as ZnO and CdS, and mixtures and alloys thereof. Examples of metallic compounds include nitrides such as TiN, TaN, NbN, ZrN, MoN and WN; silicides such as WSi, $TiSi_2$, and $MoSi_2$; oxides such as $TiO_x$ and $ZrO_x$; and mixtures and alloys thereof.

The dielectric layers and the gate dielectric may be made from any dielectric material conventionally known to those of ordinary skill in the art. Examples include conventional oxides, nitrides, oxynitrides, and other dielectrics, such as borophosphosilicate glass (BPSG), borosilicate glass (BSG), phosphosilicate glass, spin-on glass (SOG), silicon nitride, silicon oxide, P-doped silicon oxide (P-glass), and low k dielectric materials (such as F-doped silicon oxide), for example $SiO_2$, $Si_3N_4$, $Al_2O_3$, $SiO_xN_y$, $Ta_2O_5$, $TiO_2$ etc. The term "oxide" refers to a metal oxide conventionally used to isolate electrically active structures in an integrated circuit from each other, typically an oxide of silicon and/or aluminum (e.g., $SiO_2$ or $Al_2O_3$, which may be conventionally doped with fluorine, boron, phosphorous or a mixture thereof; preferably $SiO_2$ or $SiO_2$ conventionally doped with 1–12 wt % of phosphorous and 0–8 wt % of boron). Preferably, the dielectric layers and the gate dielectric are formed from $SiO_2$ or $Si_3N_4$.

When nitride, oxide and/or other dielectric layers are removed, they may be selectively etched, in which case the layer they are on acts as the etch stop layer. Preferably, the etch selectivity (i.e., the ratio of (a) the rate of dielectric etching to (b) the rate of etch stop material etching) is at least 2:1, preferably at least 3:1, more preferably at least 5:1 and even more preferably at least 10:1. In the case of etching silicon oxide using silicon nitride as the etch-stop layer, an etching solution of one part HF(49%) in one part deionized water will give a selectivity of greater than 1:300.

The structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

Obviously, numerous modifications and variations of the present invention are possible in light of the above teachings. It is therefore to be understood that within the scope of the appended claims, the invention may be practiced otherwise than as specifically described herein.

What is claimed is:

1. A method of forming a semiconductor structure, comprising:

filling a trench in a first dielectric layer with a gate material;

wherein said first dielectric layer is on a semiconductor substrate;

first spacers comprising a second dielectric layer are in said trench; and the first dielectric layer is a different material from the second dielectric layer; and etching said first dielectric layer to form second spacers in contact with said gate material.

2. The method of claim 1, further comprising chemical mechanical polishing said gate material.

3. The method of claim 1, wherein said first dielectric layer comprises at least one member selected from silicon oxide and silicon nitride.

4. The method of claim 1, wherein said first spacers comprise at least one member selected from silicon oxide and silicon nitride.

5. The method of claim 3, wherein said substrate comprises silicon, and said gate material comprises silicon.

6. A method of making a semiconductor device, comprising:

forming a semiconductor structure by the method of claim 1; and forming a semiconductor device from said semiconductor structure.

7. The method of claim 6, wherein said semiconductor device is a CMOS device comprising notched gate transistors.

8. A method of making an electronic device, comprising:

forming a semiconductor device by the method of claim 6; and forming an electronic device comprising said semiconductor device.

9. A method of making an electronic device, comprising:

forming a semiconductor device by the method of claim 7; and forming an electronic device comprising said semiconductor device.

10. A method of making a semiconductor structure, comprising:

patterning a first dielectric layer, on a semiconductor substrate, to form a trench in said dielectric layer;

forming first spacers in said trench comprising a second dielectric layer, wherein the first dielectric layer is a different material from the second dielectric layer;

filling said trench with a gate material; and etching said first dielectric layer to form second spacers in contact with said gate material.

11. The method of claim 10, further comprising chemical mechanical polishing said gate material.

12. The method of claim 10, wherein said first dielectric layer comprises at least one member selected from silicon oxide and silicon nitride.

13. The method of claim 10, wherein said first spacers comprise at least one member selected from silicon oxide and silicon nitride.

14. The method of claim 12, wherein said substrate comprises silicon, and said gate material comprises silicon.

15. A method of making a semiconductor device, comprising:

forming a semiconductor structure by the method of claim 10; and forming a semiconductor device from said semiconductor structure.

16. The method of claim 15, wherein said semiconductor device is a CMOS device comprising notched gate transistors.

17. A method of making an electronic device, comprising:

forming a semiconductor device by the method of claim 15; and forming an electronic device comprising said semiconductor device.

18. A method of making an electronic device, comprising:

forming a semiconductor device by the method of claim 16; and forming an electronic device comprising said semiconductor device.

* * * * *